US008520859B2

(12) United States Patent
Li et al.

(10) Patent No.: US 8,520,859 B2
(45) Date of Patent: Aug. 27, 2013

(54) SYSTEM FOR COMFORT NOISE INJECTION

(75) Inventors: Xueman Li, Burnaby (CA); Frank Linseisen, Vancouver (CA); Kyle MacDonald, Vancouver (CA)

(73) Assignee: QNX Software Systems Limited, Kanata, Ontario (CA)

( * ) Notice: Subject to any disclaimer, the term of this patent is extended or adjusted under 35 U.S.C. 154(b) by 0 days.

(21) Appl. No.: 13/413,239

(22) Filed: Mar. 6, 2012

(65) Prior Publication Data

US 2012/0173231 A1 Jul. 5, 2012

Related U.S. Application Data

(63) Continuation of application No. 11/930,968, filed on Oct. 31, 2007, now Pat. No. 8,139,777.

(51) Int. Cl.
*H03G 3/20* (2006.01)
*G01L 19/14* (2006.01)

(52) U.S. Cl.
USPC ............. 381/57; 381/56; 381/71.1; 381/73.1; 704/225; 704/226; 704/E19.039

(58) Field of Classification Search
USPC .................. 381/56, 57, 71.1, 73.1; 704/225, 704/226, E19.039
See application file for complete search history.

(56) References Cited

U.S. PATENT DOCUMENTS

| | | | | | |
|---|---|---|---|---|---|
| 5,933,495 | A * | 8/1999 | Oh | ........................... | 379/406.08 |
| 6,141,415 | A * | 10/2000 | Rao | .......................... | 379/406.08 |
| 6,675,125 | B2 * | 1/2004 | Bizjak | ........................... | 702/179 |
| 2008/0044036 | A1 * | 2/2008 | Konchitsky | .................. | 381/71.1 |
| 2010/0311463 | A1 * | 12/2010 | Konchitsky et al. | ....... | 455/550.1 |

* cited by examiner

*Primary Examiner* — Victor A Mandala
(74) *Attorney, Agent, or Firm* — Brinks Hofer Gilson & Lione

(57) ABSTRACT

A noise injection system adds comfort noise to an audio signal. The system includes a background noise estimator that determines a spectral content of a background noise associated with the audio signal. A comfort noise generator generates a comfort noise signal having a random phase. A gain circuit adjusts the comfort noise signal based on the spectral content of the background noise. A combining circuit combines a gain-adjusted comfort noise signal and the audio signal to generate an output signal.

20 Claims, 9 Drawing Sheets

SYSTEM FOR COMFORT NOISE INJECTION

PRIORITY CLAIM

This application is a Continuation of U.S. patent application Ser. No. 11/930,968 filed on Oct. 31, 2007, now U.S. Pat. No. 8,139,777 issued on Mar. 20, 2012.

BACKGROUND

1. Technical Field

This disclosure relates to communications systems. In particular, this disclosure relates to the injection of comfort noise in an audio communication system.

2. Related Art

Communication systems may inject noise into an audio signal. The noise ("comfort noise") may improve the audio quality. The noise may provide a user in a telecommunication system with an indication that a connection is intact. A mismatch between the injected comfort noise and the background noise of the audio signal may result in a perceptible audio artifact when the signal is heard.

The mismatch between the comfort noise and the background noise in the audio signal may cause gating, which may manifest as a varying magnitude of background noise in the audio output signal. Gating may adversely affect the quality and intelligibility of the audio output signal. Gating may cause listener fatigue, and may degrade the performance of automatic speech recognition (ASR) systems.

SUMMARY

A noise injection system adds comfort noise to an audio signal. The system includes a background noise estimator to determine a spectral content of a background noise associated with the audio signal. A comfort noise generator generates a comfort noise signal having a randomized phase. A gain circuit generates a gain value for adjusting the comfort noise signal based on the determined spectral content of the background noise, and generates a gain-adjusted comfort noise signal. A combining circuit combines the gain-adjusted comfort noise signal and the audio signal to generate an output signal.

Other systems, methods, features, and advantages will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The system may be better understood with reference to the following drawings and description. The components in the figures are not necessarily to scale, emphasis instead being placed upon illustrating the principles of the invention. Moreover, in the figures, like-referenced numerals designate corresponding parts throughout the different views.

DETAILED DESCRIPTION OF THE PREFERRED EMBODIMENTS

Hands-free systems, communication devices, and wireless telephones in vehicles or enclosures may be susceptible to noise. The spatial, linear, and non-linear properties of noise may degrade speech quality and cause listener fatigue. A speech enhancement system may improve speech quality by generating a steady soothing noise, referred to as "comfort noise."

Communication systems, especially wireless communication systems, may suffer bandwidth limitations. To reduce bandwidth requirements, digital communication systems, such as wireless or mobile telephone systems, may transmit speech signals and eliminate the background noise signals. This may create in a very quiet communication link between the calling party and the receiving party. The communication system at the receiving side may inject a comfort noise to reassure a user that the connection between the parties is intact. The comfort noise may provide the user with a "smooth" sounding background.

Figure 1:
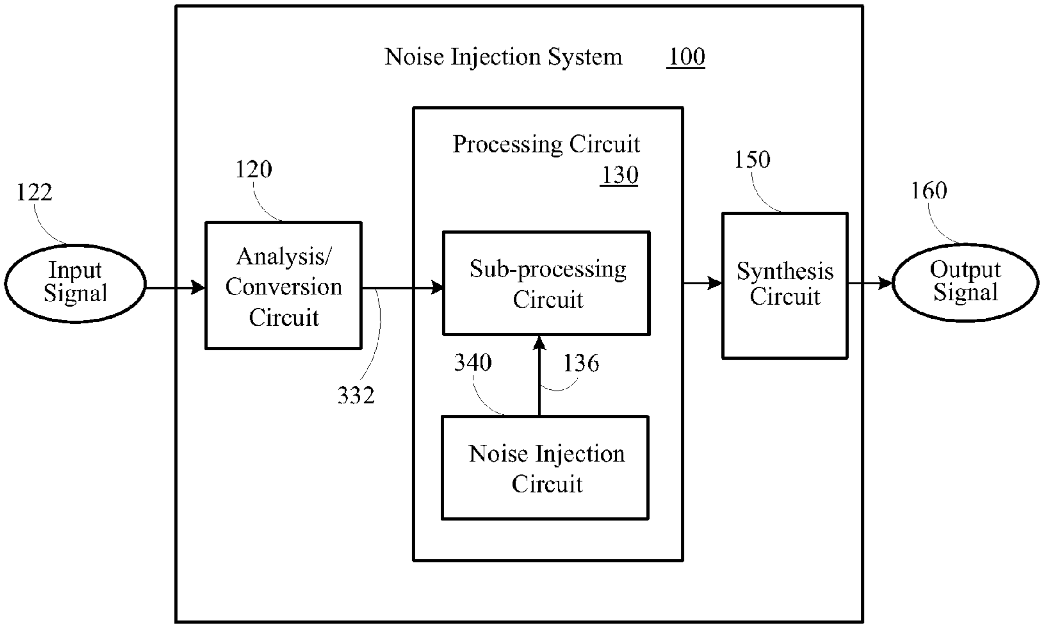
FIG. 1 is a noise injection system.

FIG. 1 is a noise injection system 100. The noise injection system 100 may include a conversion circuit 120, which may receive an input signal 122. The conversion circuit 120 may transform the input signal 122 from the time domain to the frequency domain. The conversion circuit 120 may be an analysis circuit or analysis stage. A processing circuit 130 may process the input signal 122 in the frequency domain and may inject a comfort noise signal 136. A synthesis circuit 150 may receive the processed signal and transform it from the frequency domain to the time domain, to generate an output signal 160.

Figure 2:
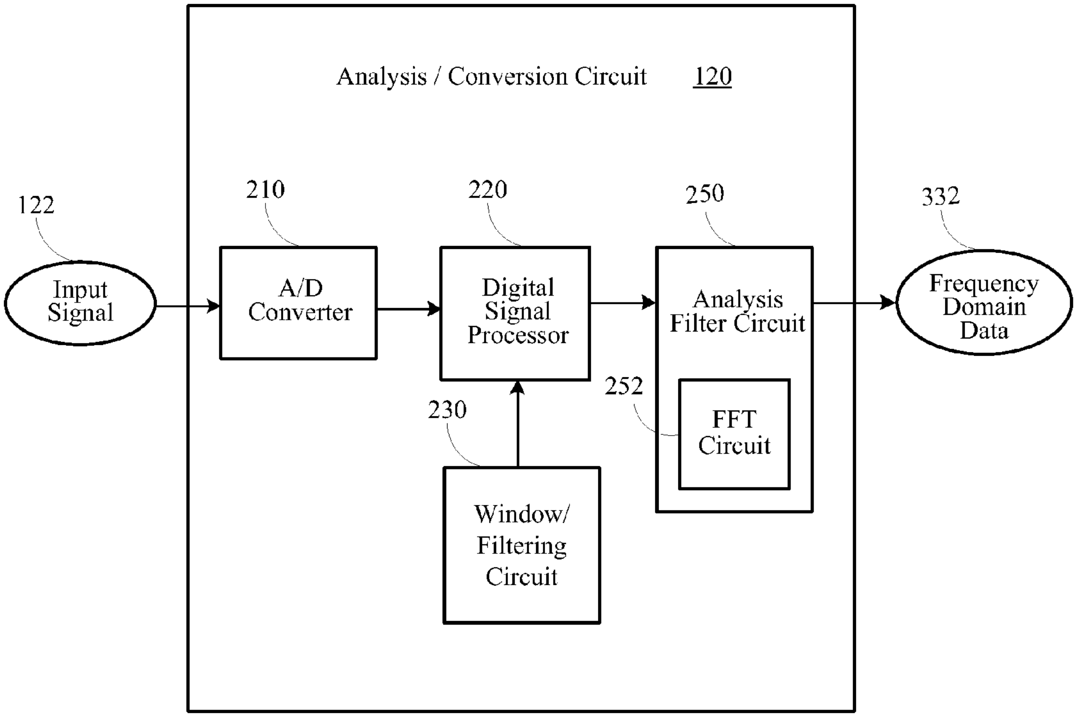
FIG. 2 is a conversion circuit.

FIG. 2 is the conversion circuit 120. An analog-to-digital converter 210 may convert the input signal 122, such as a time-domain speech signal, into digital format. A digital signal processor 220 (DSP) may process the digitized input signal 122 as a plurality of digitized samples. The DSP 220 may process the digitized samples in a block format. For example, the digitized samples may be processed in blocks of 256 digitized samples, where each block may overlap a previous block by a predetermined number of samples. Consecutive blocks may overlap by about a one-half block length, or by about 128 samples. The block overlap or frame shift, may be equal to about 50%. The amount of overlap between blocks and the number of samples per block may vary, and may depend on system requirements. The quality of the output signal may be increased if the frame shift is reduced, but at the cost of computational load.

A window/filter circuit 230 may process a block of data using a window function. Windows used in processing may include a rectangular window, a triangular window, a Hanning window, a Hamming window, or a Blackman window. Other types of windows may be used depending upon system criteria, such as pass-band, side-lobe attenuation, and other windows. The window/filter circuit 230 may apply a polyphase filter or other filter. Application of window functions and/or filters may improve frequency resolution. The window/filter circuit 230 may be an analysis window circuit, analysis window processing or analysis filtering.

An analysis filter circuit 250 may extract spectral components of the data. The analysis filter circuit 250 may be part of the DSP 220, or it may be separate from the DSP 220. The DSP 220 and/or the analysis filter circuit 250 may include one or more Fast Fourier Transform (FFT) circuits 252, or it may include one or more linear prediction analysis filters. The FFT circuit 252 may convert the data from the time domain to the frequency domain. The linear prediction filter coefficients may be adapted using a normalized least mean squares process or other adaptive filtering processes, such as recursive least squares or proportional least mean squares.

The digital signal processor 220 may execute instructions that delay an input signal one or more additional times, or perform pre-processing, such as noise reduction, energy tracking, or may attenuate or boost an amplitude of a signal. The digital signal processor 220 may be discrete logic or circuitry, a mix of discrete logic and a processor, or comprise multiple processors or software programs.

Figure 3:
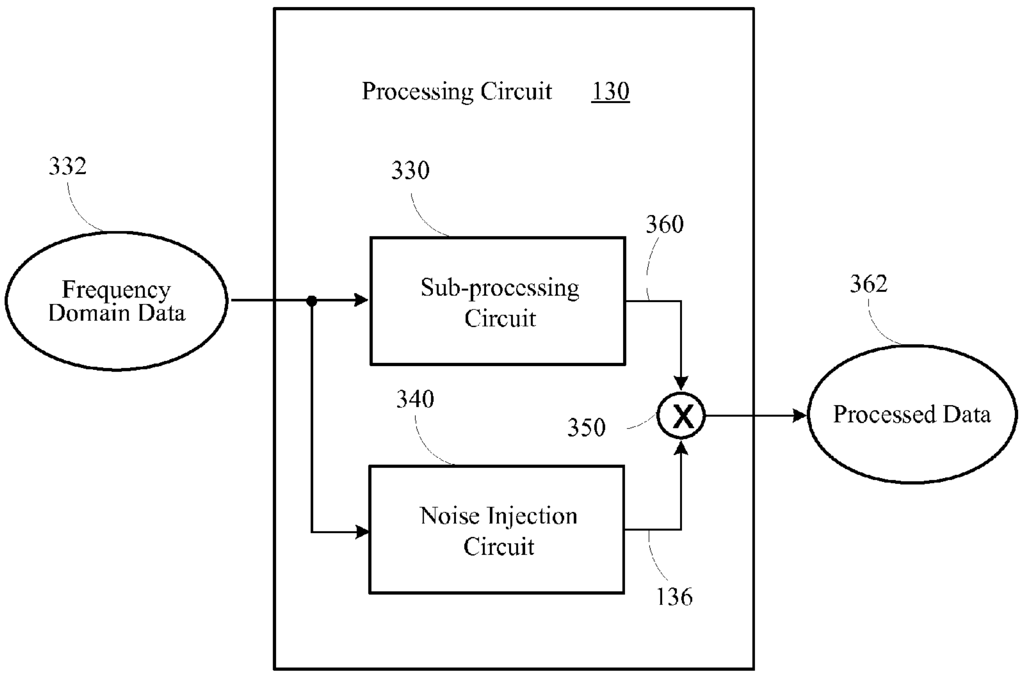
FIG. 3 is a processing circuit.

FIG. 3 is the processing circuit 130. A sub-processing circuit 330 may receive frequency domain data 332 from the conversion circuit 120. The sub-processing circuit 330 may perform additional processing, such as noise reduction, echo-cancellation, and signal reinforcement. Other signal processing may be performed. A noise generation circuit 340 may generate the comfort noise signal 136, which may have a semi-stable power spectral density. A combining circuit 350 may combine the comfort noise signal 136 with frequency domain processed data 360 to generate processed data 362. The processing circuit 130 may provide processed data 362 to the synthesis circuit 150.

Noise injection or comfort noise generation may be based on random number generation using a random number generator. The comfort noise may be a form of a random noise. While the power spectral density of the random noise may be matched to the noise estimation, phase matching may be difficult. Therefore, the phase of the injected noise may be randomized. However, when injected noise with a random phase is converted from the frequency domain to the time domain, it may not have the same magnitude as the noise that was passed through the system. The noise estimate may correspond to the noise of the input signal after it is processed by the analysis filters 230.

The difference in magnitude between the injected noise and the pass through noise may generate perceptible artifacts, referred to as gating. Gating may be heard as a difference in noise volume, which may annoy the user. Gating may affect the performance of automatic speech recognition systems that processes audio in the time domain. Gating may reduce the accuracy of recognition systems.

Some systems may require a manual "tuning" to compensate for and correct gating. The tuning processes may be cumbersome and expensive, and may need to be performed each time a system parameter is changed. A closed processing solution that reduces or eliminates gating may eliminate the need for a manual system tuning.

Figure 4:
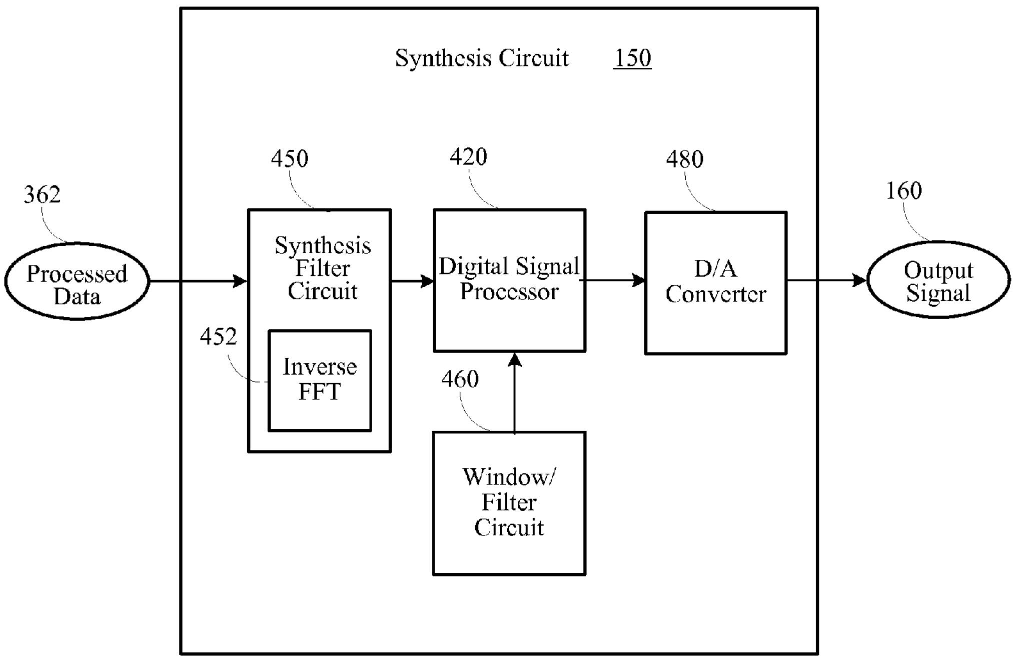
FIG. 4 is a synthesis circuit.

FIG. 4 is the synthesis circuit 150. The synthesis circuit 150 may receive the processed data 362 (frequency domain data) from the processing circuit 130. A synthesis filter 450 may reconstruct a time domain signal using the processed data 362. A digital signal processor 420 (DSP) may post-process the reconstructed data. The synthesis filter circuit 450 may be part of or separate from DSP 420. The DSP 420 and/or the synthesis filter may include one or more Inverse Fast Fourier Transform (IFFT) circuits 452, or it may include one or more linear prediction filters. The IFFT circuit 452 may convert the processed data 362 from the frequency domain to the time domain. The linear prediction filter coefficients may be the same as the coefficients in the analysis filter 250.

A window/filter circuit 460 may process the time domain data using window functions and/or filters. Processing using window functions and filters, such as polyphase filters, may avoid discontinuities when the signal is processed in overlapping blocks. The window/filter circuit 460 may be a synthesis window circuit that performs synthesis window processing or synthesis filtering. A digital-to-analog converter 480 may convert the digital time-domain signal into analog format output data 160 for reproduction by a transducer, such as a loudspeaker or headset component.

Figure 5:
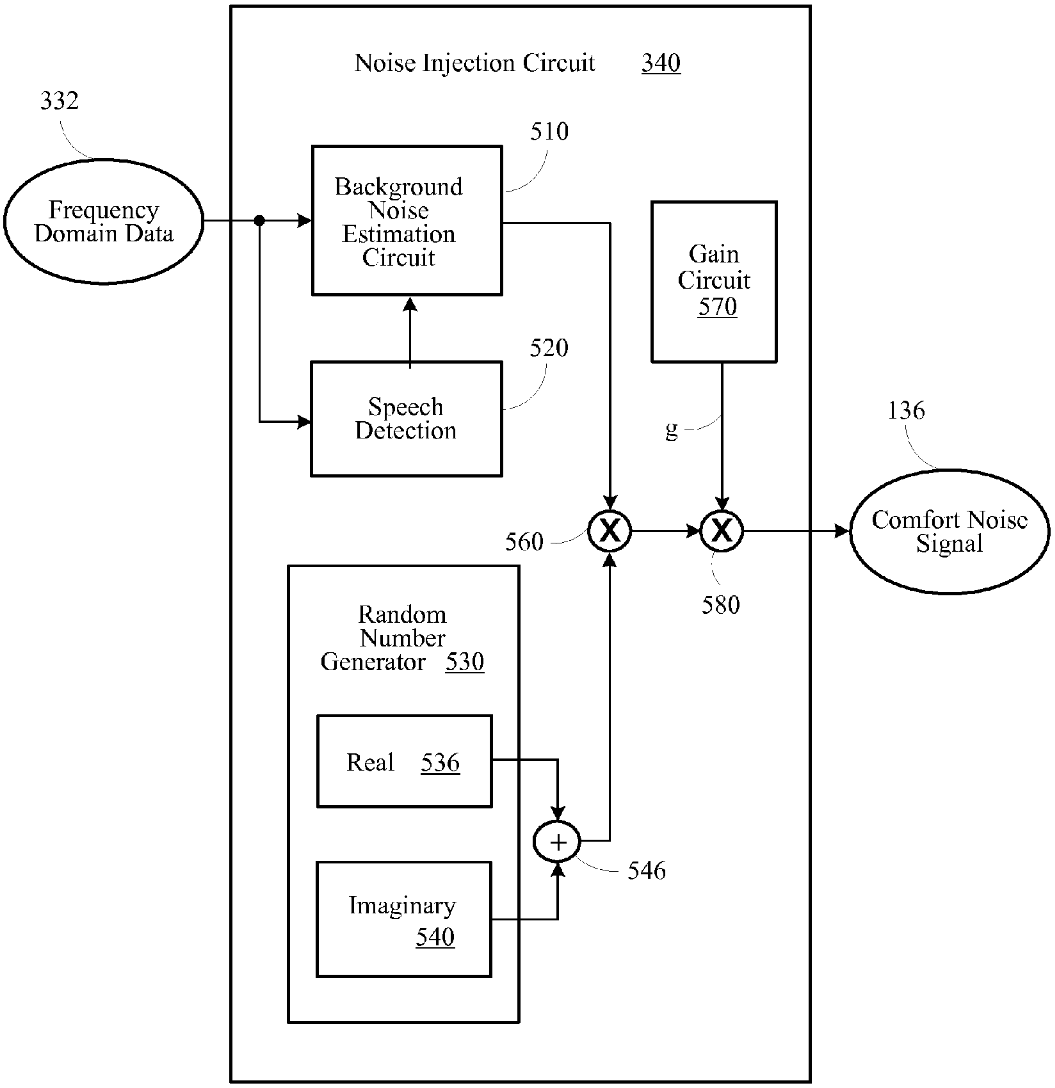
FIG. 5 is a noise generation circuit.

FIG. 5 is the noise generation circuit 340. The noise generation circuit 340 may receive the processed signal from the sub-processing circuit 130. The random noise (pseudo-random noise) or comfort noise that is injected may be a closed-form representation of the comfort noise. The random noise may be robust relative to different frame shifts, and may be robust relative to various windows and/or filter functions applied to the signal by the conversion circuit 120 and/or the synthesis circuit 150. The noise generation circuit 340 may generate noise in the frequency domain that may match the statistical properties of the local background noise. Thus, the power spectrum of comfort noise injected may match the power spectrum of the background noise signal in the system. This may eliminate gating when the synthesis filter circuit 450 converts the signal into the time domain.

A background noise estimation circuit 510 may estimate the power spectrum of the background noise, and may generate a magnitude value at the various frequencies to match the spectral shape of the background noise. A speech detection circuit 520 may provide a signal to the background noise estimation circuit 510 so that background noise may be sampled between speech segments.

The speech detection circuit 520 may determine speech activity based on an average value of the input signal. The speech detection circuit 520 may measure the energy of the envelope of the input signal. When the energy of the envelope exceeds a predetermined value, for example, twice the average background level, the speech detection circuit 520 may issue a signal to the background noise estimation circuit 510 indicating the presence of speech. Accurate speech detection assumes that the energy of the speech signal is greater than the energy of the background noise signal.

Because the analysis filter 250 of the conversion circuit 120 may provide complex data, a random number generator 530 may generate a random number having a real portion and an imaginary portion. A real random number generation circuit 536 may generate the real portion of the random number, while an imaginary random number generation circuit 540 may generate the imaginary portion of the random number. At each frequency or frequency bin, the real and imaginary random number generation circuits 536 and 540 may independently generate a Gaussian random number having a zero mean and a unit variance. The random numbers generated may range from about −1 to about +1. The Gaussian random numbers may correspond to the real and imaginary portions of the complex comfort noise. A summing circuit 546 may sum the real and imaginary portions.

Based on the output of the background noise estimation circuit 510, a multiplier circuit 560 may scale the magnitude of the generated noise to match the background noise level at the corresponding frequency bin. Randomizing the phase of the injected noise may eliminate the need to track the phase and encode phase information when transmitting data through the communication system. This may reduce the computational load and bandwidth requirements of the communication system.

Randomizing the phase may attenuate narrow band noise, such as tonal noise, which may be present in the input signal 122. Because some of the energy of the tonal noise signal may be preserved in the phase, reducing the amplitude of the tonal noise may not totally eliminate it. Randomizing the phase of the injected noise may further reduce the effects of tonal noise so that artifacts may not be heard in the injected comfort noise. The random number may be generated by the random number generation circuit 530 based in hardware, or may be provided by software processes, such as processes based on seed number selection.

A gain circuit 570 may generate a gain factor corresponding to each frequency bin. The gain factor may compensate for the difference between the local noise and the injected comfort noise when the data is transformed back to the time domain. A multiplier circuit 580 may apply the gain factor to the signal. The gain factor may range between about 0 and about 5, where a value of 1 may represent unity gain. Other gain factors may be used. The gain factor may compensate the energy loss or increase of the injected comfort noise, because the original phase information was not tracked. Application of the gain may compensate for such loss of phase information.

Figure 6:
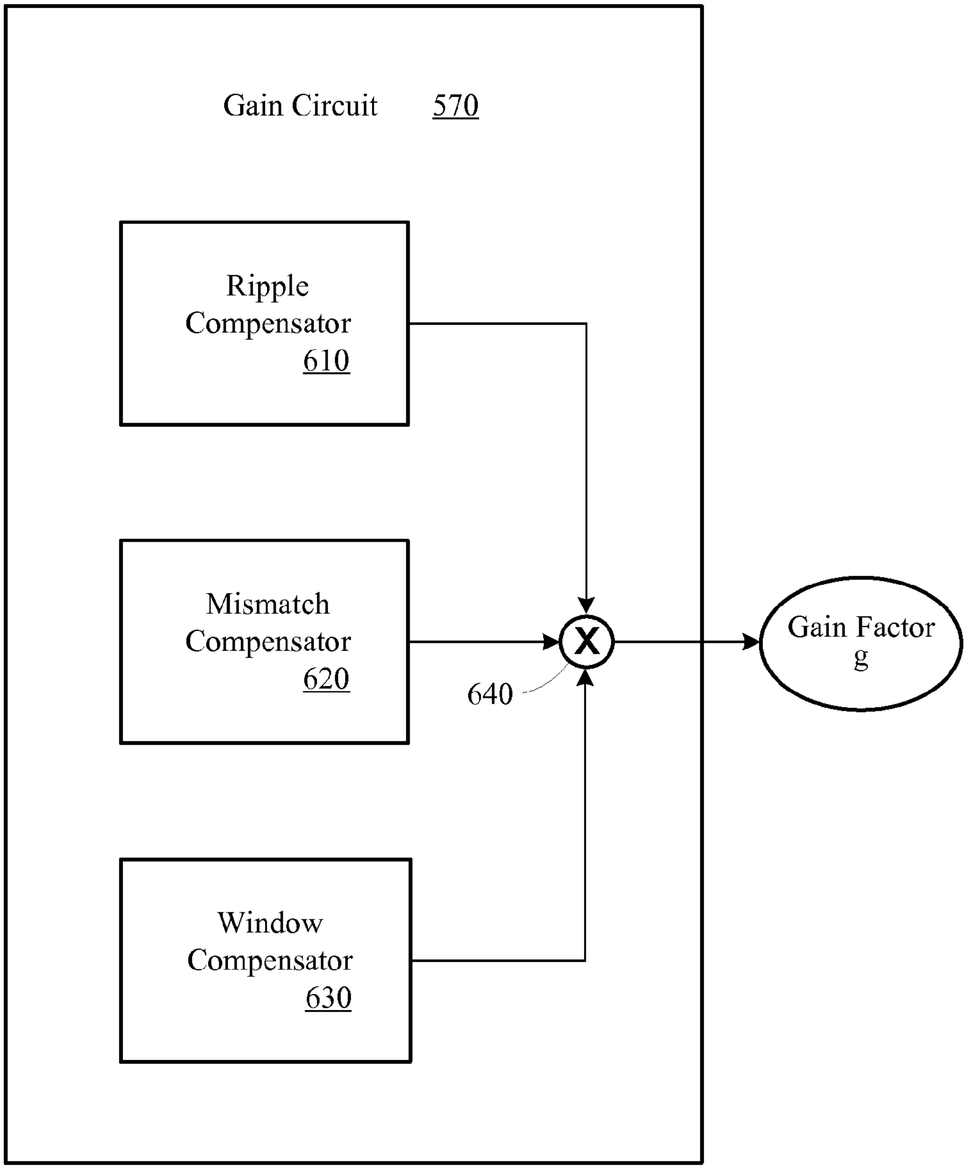
FIG. 6 is a gain circuit.

FIG. 6 is the gain circuit 570. The gain circuit 570 may include a ripple compensator 610, a mismatch compensator 620, and a window compensator 630. A multiplier circuit may multiply the output from the ripple compensator 610, the mismatch compensator 620, and the window compensator 630, to generate the gain factor. Calculation of the gain factor "g" may be represented as a closed parameter described in Equation 1.

$$g=\left(\frac{1}{1+\sigma_s}\right)\left(\sqrt{\frac{\sum T_o^2}{\sum \omega_a\omega_s^2}}\right)\left(\frac{\sqrt{\omega_a\omega_s^2}}{\sqrt{\omega_a^2}\sqrt{\omega_s^2}}\right) \quad \text{(Eqn. 1)}$$

The first term may be generated by the ripple compensator 610, the second term may be generated by the mismatch compensator 620, and the third term may be generated by the window compensator 630.

The first term, $$\left(\frac{1}{1+\sigma_s}\right),$$

may compensate for an energy increase caused by ripples (varying amplitudes) in the output signal 160. The window and filter functions applied by the conversion circuit 120 and synthesis circuit 150, respectively, may be designed such that when the windows and/or filters are applied, a uniform energy output may be achieved using an overlap-and-add synthesis process. Introducing random phase for the injected comfort noise may affect the windowing properties. Random phase may cause ripple, which may change the energy of the output signal. A ripple compensator 610 may compensate for such ripples.

The second term, $$\left(\sqrt{\frac{\sum T_o^2}{\sum \omega_a\omega_s^2}}\right),$$

may adjust for a mismatch between coherent and incoherent overlapping data. A time domain framed-shifted signal may be coherent with the signal in a previous frame or a subsequent frame because of the frame-to-frame overlap. Because frame buffers may overlap due to frame shift in initial processing, there may be data in common between the data blocks, thus providing the coherence. However, the injected random noise or comfort noise may no longer be coherent with respect to the previous or subsequent frame of noise due to the phase randomization. Such loss of coherence between frames may result in a loss of energy when signals are overlapped and added by the synthesis circuit 150. The mismatch compensator 620 may compensate for this loss of energy.

The third term, $$\left(\frac{\sqrt{\omega_a\omega_s^2}}{\sqrt{\omega_a^2}\sqrt{\omega_s^2}}\right),$$

may compensate for the removal of energy caused by the mismatch of windowing functions and filters. For example, the window/filtering circuit 230 of the conversion circuit 120 may apply a first Hann window. The window/filtering circuit 460 of the synthesis circuit 150 may apply a second Hann window to the Hann-windowed signal. A combined window may be equal to two Hann windows multiplied together. When a random phase is introduced, the first window applied in the analysis circuit 120 may no longer be a Hann window, while the combined window may no longer be equal to two Hann windows multiplied together. Application of random phase for comfort noise may affect the magnitude of the combined window and thus affect the energy of a processed signal. The window compensator 630 may compensate for this energy change.

Equation 1 is reproduced below:

$$g=\left(\frac{1}{1+\sigma_s}\right)\left(\sqrt{\frac{\sum T_o^2}{\sum \omega_a\omega_s^2}}\right)\left(\frac{\sqrt{\omega_a\omega_s^2}}{\sqrt{\omega_a^2}\sqrt{\omega_s^2}}\right) \quad \text{(Eqn. 1)}$$

The terms $\Omega_a$ and $\Omega_s$ may correspond to the analysis and synthesis window or prototype filters, respectively.

The value of the root-mean-squares (RMS) of the synthesis and analysis window or prototype filter may be given by Equation 2, as follows:

$$\sqrt{\omega_s^2}=\sqrt{\frac{\sum_{i=0}^{N} c_s(i)^2}{N}} \text{ and } \sqrt{\omega_a^2}=\sqrt{\frac{\sum_{i=0}^{N} c_a(i)^2}{N}} \quad \text{(Eqn. 2)}$$

The terms $c_a$ and $c_s$ may be the coefficients of the analysis and synthesis windows or prototype filter respectively, where N is the window or prototype filter length.

Equation 3 below may represent the summation of the analysis and synthesis windowing or prototype filter coefficients multiplied together by a multiplier circuit 640.

$$\sum \omega_a\omega_s^2=\sum_{i=1}^{N}(c_a(i)c_s(i))^2 \quad \text{(Eqn. 3)}$$

The value of N may be the length of the filters. If the analysis filters have a different length than the synthesis filters, the smaller of the two values may be used, and the larger filter may be down-sampled to be about equal in length.

Equation 4 may represent the root-mean-square of the analysis and synthesis windowing or prototype filter coefficients multiplied together:

$$\sqrt{\omega_a\omega_s^2} = \sqrt{\frac{\sum_{i=0}^{N}(c_a(i)\cdot c_s(i))^2}{N}}, \quad \text{(Eqn. 4)}$$

The term $\sigma_s$ may be the standard deviation of the synthesis filter based on an overlapped and added synthesis filter over the length of the frame shift of the system, as shown by Equation 5.

$$\sigma_s = \sqrt{\frac{1}{FS}\sum_{i=1}^{FS}(T_s(i) - \overline{T_s})^2} \quad \text{(Eqn. 5)}$$

where FS=frameshift, and $T_s$ is given by Equation 6, as follows:

$$T_s(i) = \sum_{j=1}^{M} c_s(i + (j-1)N) \quad \text{(Eqn. 6)}$$

where $$M = \left\lfloor \frac{\text{length}(FFT)}{\text{frameshift}} \right\rfloor$$

and $\overline{T_s}$ is the mean of $T_s(i)$.

The value of $T_o$ may be given by Equation 7, as follows:

$$T_o(i) = \sum_{j=1}^{M} c_a(i + (j-1)N)c_s(i + (j-1)N) \quad \text{(Eqn. 7)}$$

where $$M = \left\lfloor \frac{\text{length}(FFT)}{\text{frameshift}} \right\rfloor$$

Figure 7:
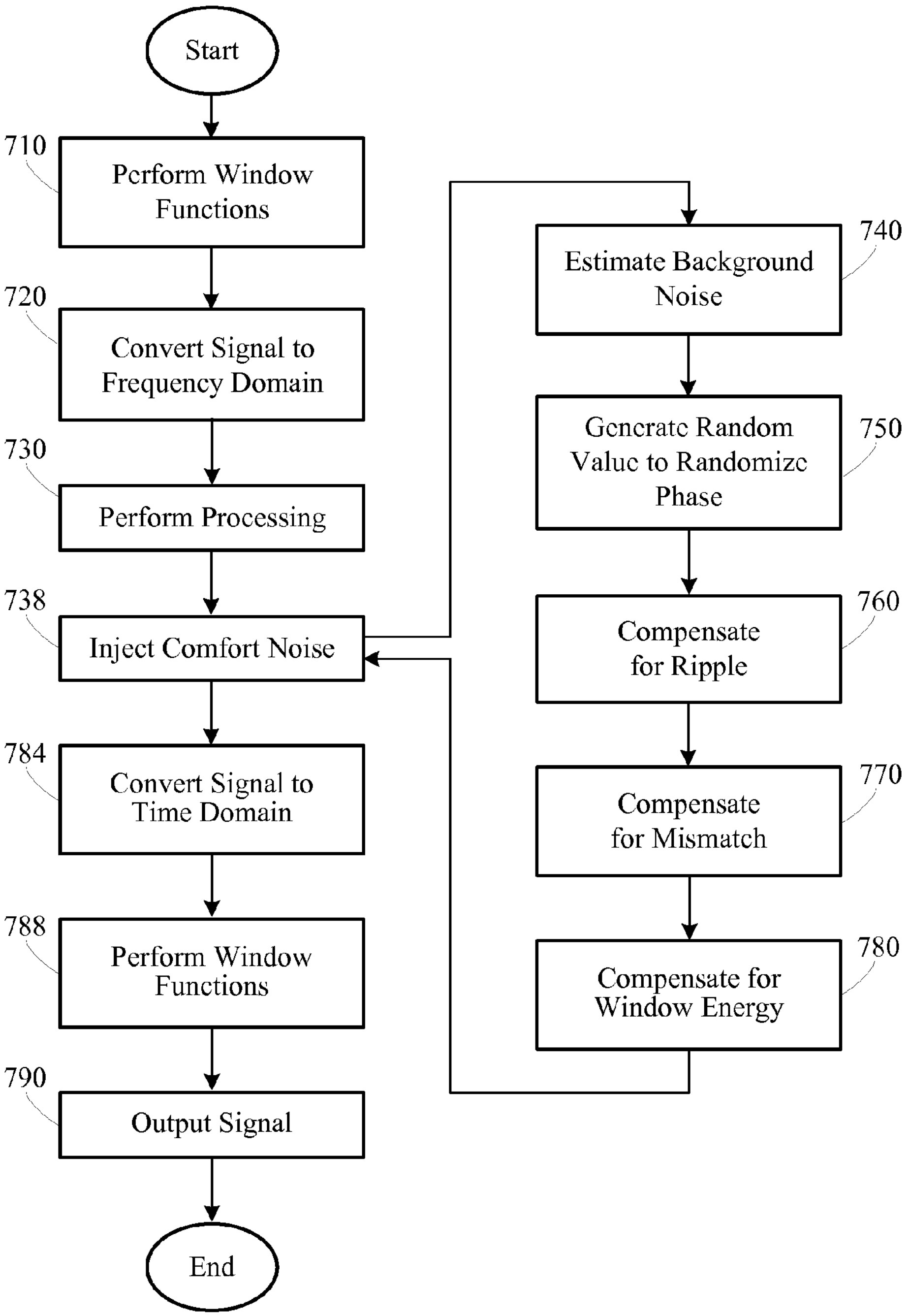
FIG. 7 is a gain compensation process.

FIG. 7 is a process 700 for injecting noise. Window and filter functions may be applied to the time domain signal (Act 710). A time domain signal may be converted to the frequency domain (Act 720). Processing, such as noise reduction and echo-cancellation may be performed in the frequency domain (Act 730). A noise signal or comfort noise may be injected (Act 738). Noise injection may include estimating a background noise level (Act 740) and generating a complex random number to randomize the phase of the signal (Act 750). A gain factor may be applied, which may include compensating for ripple (Act 760), compensating for coherency mismatch due to overlapping windows (Act 770), and compensating for window energy loss due to window functions and filtering (Act 780). Next, the signal may be converted from the frequency domain back to the time domain (Act 784). Window and filter functions may be applied to the time domain signal (Act 788). The signal may be converted to analog format and output to a subsequent stage (Act 790).

Figure 8:
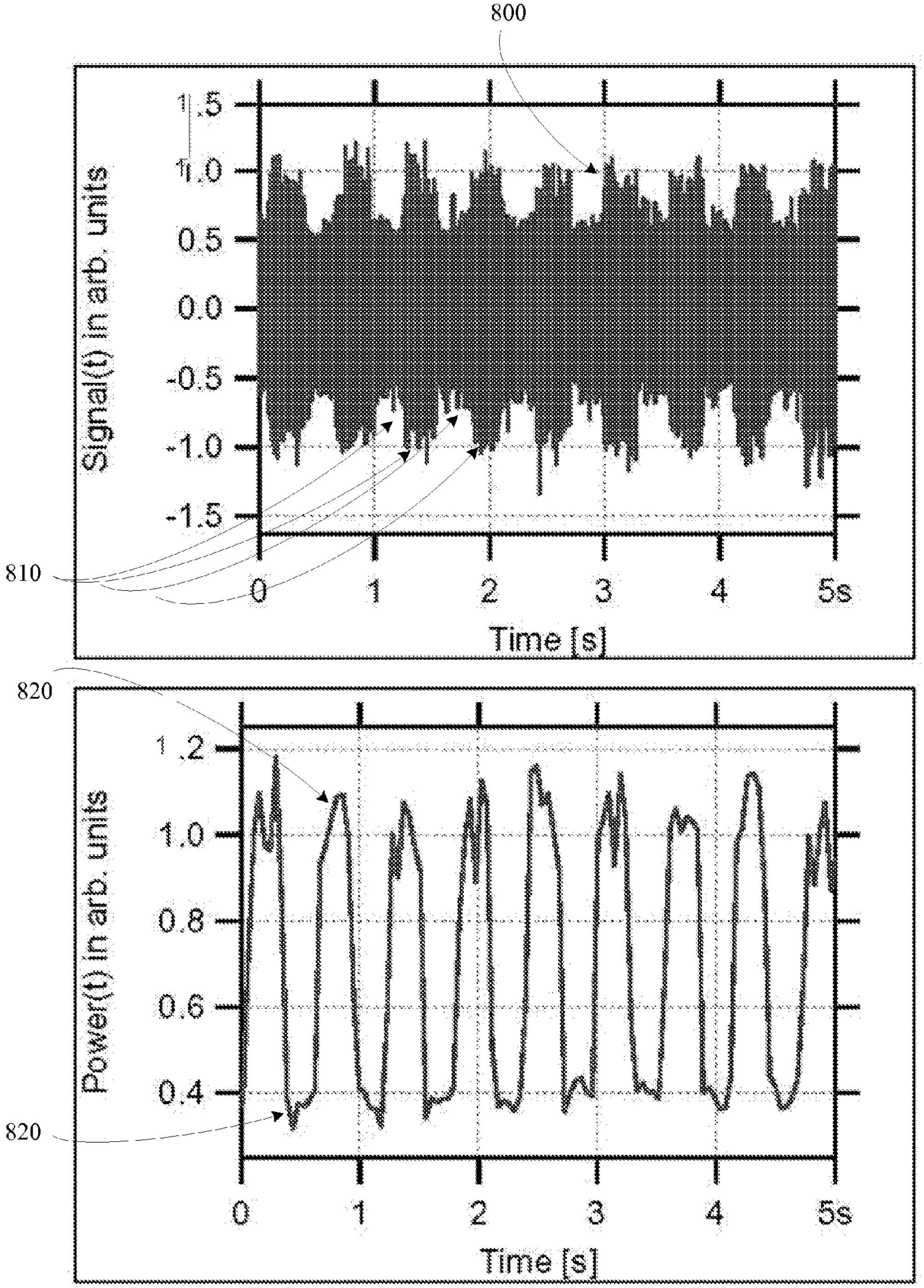
FIG. 8 is an output signal without noise injection gain compensation.

FIG. 8 is an output signal 800 of the noise injection system 100 when white noise is input to the system. The upper panel may represent the output signal corresponding to 5 seconds of data, with comfort noise injected without gain compensation every other 300 milliseconds. The X-axis may represent time in seconds, while the Y-axis may represent signal amplitude. The lower panel may represent the power level corresponding to the signal of the upper panel. The injected comfort noise may not be gain compensated. The signal may have a randomized phase with no compensation for the background noise spectral shape. Thus, the signal may exhibit gating, which may be indicated by the variation 810 in amplitude of the signal and the corresponding variation in power 820.

Figure 9:
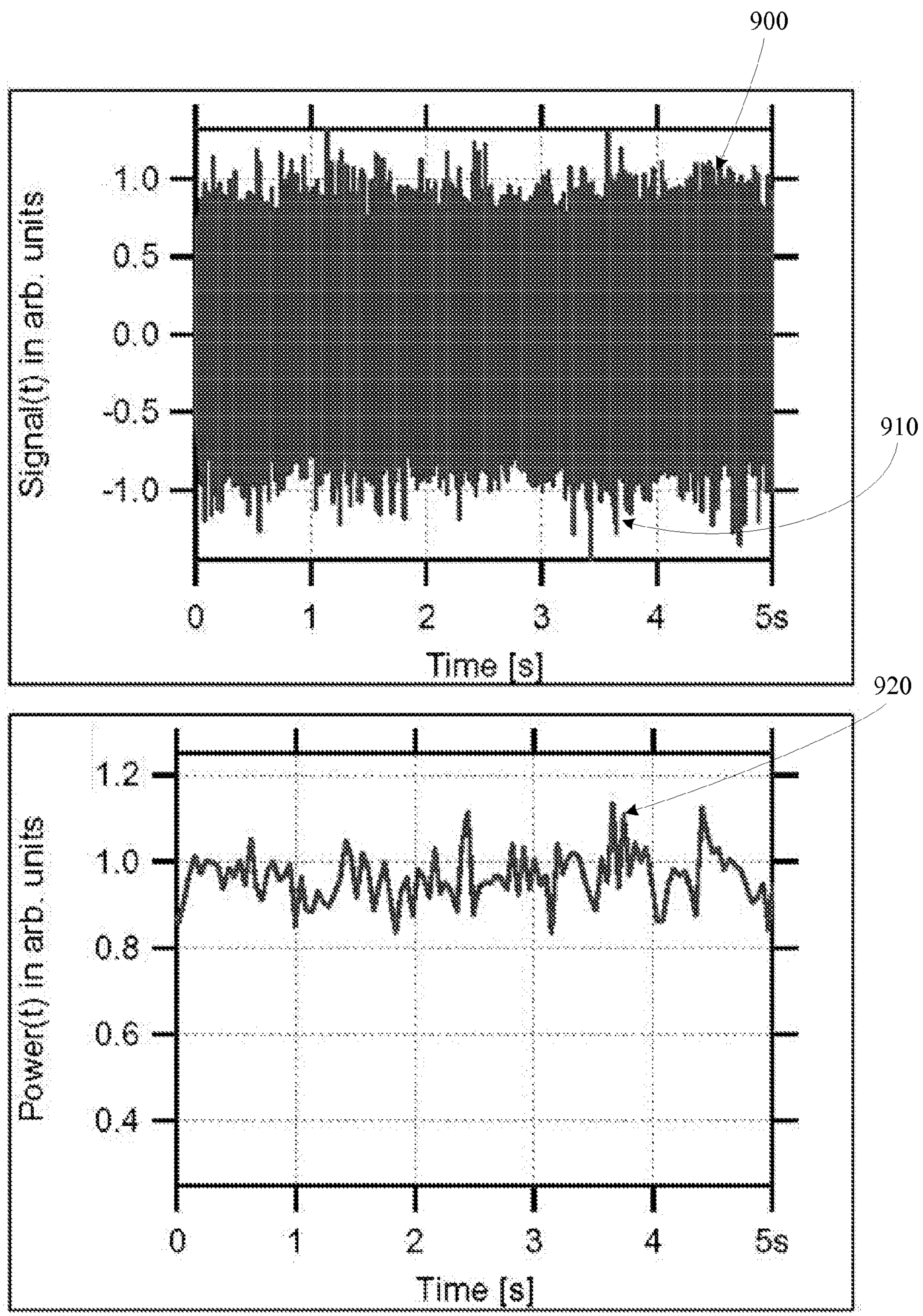
FIG. 9 is an output signal with noise injection gain compensation.

FIG. 9 is an output signal 900 of the noise injection system 100 when white noise is input to the system. The upper panel may represent the output signal corresponding to 5 seconds of data, with comfort noise injected having gain compensation every other 300 milliseconds. The X-axis may represent time in seconds, while the Y-axis may represent signal amplitude. The lower panel represents the power level corresponding to the signal of the upper panel. The injected comfort noise may have a randomized phase, which may be spectrally adjusted based on background noise spectral shape. The injected comfort noise may be gain compensated. Thus, gating may be minimized or eliminated, which may be indicated by the lack of variation in amplitude of signal 910 and the corresponding lack of variation in power 920. Smooth random fluctuations in the signal may be indicated.

The logic may be represented in (e.g., stored on or in) a computer-readable medium, machine-readable medium, propagated-signal medium, and/or signal-bearing medium. The media may comprise any device that contains, stores, communicates, propagates, or transports executable instructions for use by or in connection with an instruction executable system, apparatus, or device. The machine-readable medium may selectively be, but is not limited to, an electronic, magnetic, optical, electromagnetic, or infrared signal or a semiconductor system, apparatus, device, or propagation medium. A non-exhaustive list of examples of a machine-readable medium includes: a magnetic or optical disk, a volatile memory such as a Random Access Memory "RAM," a Read-Only Memory "ROM," an Erasable Programmable Read-Only Memory (i.e., EPROM) or Flash memory, or an optical fiber. A machine-readable medium may also include a tangible medium upon which executable instructions are printed, as the logic may be electronically stored as an image or in another format (e.g., through an optical scan), then compiled, and/or interpreted or otherwise processed. The processed medium may then be stored in a computer and/or machine memory.

The systems may include additional or different logic and may be implemented in many different ways. A controller may be implemented as a microprocessor, microcontroller, application specific integrated circuit (ASIC), discrete logic, or a combination of other types of circuits or logic. Similarly, memories may be DRAM, SRAM, Flash, or other types of memory. Parameters (e.g., conditions and thresholds) and other data structures may be separately stored and managed, may be incorporated into a single memory or database, or may be logically and physically organized in many different ways. Programs and instruction sets may be parts of a single program, separate programs, or distributed across several memories and processors. The systems may be included in a wide variety of electronic devices, including a cellular phone, a headset, a hands-free set, a speakerphone, communication interface, or an infotainment system.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

We claim:

1. A noise injection system for adding comfort noise to an audio signal, comprising:

a background noise estimator configured to determine spectral content of a background noise associated with the audio signal when speech is detected in the audio signal;

a comfort noise generator configured to generate a comfort noise signal having a randomized phase;

a gain circuit configured to calculate a gain value for adjusting the comfort noise signal based on the determined spectral content of the background noise to generate a gain-adjusted comfort noise signal; and a combining circuit configured to combine the gain-adjusted comfort noise signal and the audio signal to generate an output signal when speech is not detected in the audio signal.

2. The system of claim 1 wherein the background noise estimator determines spectral content in the presence of speech in the audio signal.

3. The system of claim 2 wherein the background noise is present at a source of the speech.

4. The system of claim 3 wherein the source of the speech comprises a speaker.

5. The system of claim 1 wherein the generated comfort noise is included when the speech is not detected.

6. The system of claim 5 wherein the generated comfort noise is included in the gaps in the speech.

7. The system of claim 6 wherein the generated comfort noise mimics the background noise.

8. The system of claim 1 further comprising:

an analysis filter configured to filter time domain input data on a block basis using overlapping blocks of the time domain input data, the time domain input data representing an input signal;

a first conversion circuit configured to convert the time domain input data into the frequency domain data;

a second conversion circuit configured to convert the frequency domain output data into time domain output data; and a synthesis filter configured to filter the time domain output data.

9. The system of claim 8 where the gain circuit comprises:

a ripple compensator configured to adjust the gain value to compensate for an energy increase due to ripples caused by processing in an overlapping block manner;

a coherency mismatch compensator configured to adjust the gain value to compensate for data coherence mismatch caused by a phase randomization and processing in an overlapping block manner; and a window compensator configured to adjust the gain value to compensate for a loss in energy due to the filtering of the time domain input data and/or the time domain output data.

10. A method for adding comfort noise to an audio signal, comprising:

determining spectral content of a background noise associated with the audio signal when speech is detected in the audio signal;

generating a comfort noise signal having a randomized phase;

calculating a gain value for adjusting the comfort noise signal based on the determined spectral content of the background noise to generate a gain-adjusted comfort noise signal; and combining the gain-adjusted comfort noise signal and the audio signal to generate an output signal when speech is not detected in the audio signal.

11. The method of claim 10 wherein the determining is with a background noise estimator.

12. The method of claim 10 wherein the generating is with a comfort noise generator.

13. The method of claim 10 wherein the calculating is with a gain circuit.

14. The method of claim 10 wherein the combining is with a combining circuit.

15. A noise injection system for injecting comfort noise into an audio signal, comprising:

a background noise estimator configured to determine spectral content of a background noise associated with the audio signal when speech is detected in the audio signal;

a comfort noise generator configured to generate a comfort noise signal having a randomized phase;

a gain circuit configured to calculate a gain value for adjusting the comfort noise signal based on the determined spectral content of the background noise to generate a gain-adjusted comfort noise signal, wherein the gain-adjusted comfort noise signal approximates the background noise; and a combining circuit configured to combine the gain-adjusted comfort noise signal and the audio signal to generate an output signal, wherein the combination of the gain-adjusted comfort noise signal is at gaps when speech is not detected in the audio signal.

16. The system of claim 15 wherein the background noise estimator determines spectral content in the presence of speech in the audio signal.

17. The system of claim 16 wherein the background noise is present at a source of the speech.

18. The system of claim 17 wherein the source of the speech comprises a speaker.

19. The system of claim 15 further comprising:

an analysis filter configured to filter time domain input data on a block basis using overlapping blocks of the time domain input data, the time domain input data representing an input signal;

a first conversion circuit configured to convert the time domain input data into the frequency domain data;

a second conversion circuit configured to convert the frequency domain output data into time domain output data; and a synthesis filter configured to filter the time domain output data.

20. The system of claim 19 where the gain circuit comprises:

a ripple compensator configured to adjust the gain value to compensate for an energy increase due to ripples caused by processing in an overlapping block manner;

a coherency mismatch compensator configured to adjust the gain value to compensate for data coherence mismatch caused by a phase randomization and processing in an overlapping block manner; and a window compensator configured to adjust the gain value to compensate for a loss in energy due to the filtering of the time domain input data and/or the time domain output data.

* * * * *